April 21, 1970 D. BINGHAM 3,508,161

SEMICONDUCTOR CIRCUIT FOR HIGH GAIN AMPLIFICATION
OR FM QUADRATURE DETECTION

Filed April 14, 1967 2 Sheets-Sheet 1

INVENTOR.
DAVID BINGHAM
BY Norman N. Kunitz
Roger S. Borovoy
ATTORNEYS

INVENTOR.
DAVID BINGHAM
BY [signature]
[signature]
ATTORNEYS

United States Patent Office 3,508,161
Patented Apr. 21, 1970

3,508,161
SEMICONDUCTOR CIRCUIT FOR HIGH GAIN AMPLIFICATION OR FM QUADRATURE DETECTION

David Bingham, Mountain View, Calif., assignor to Fairchild Camera and Instrument Corporation, Syosset, N.Y., a corporation of Delaware Filed Apr. 14, 1967, Ser. No. 630,870
Int. Cl. H03d *3/14;* H03f *3/68*
U.S. Cl. 329—103 9 Claims

ABSTRACT OF THE DISCLOSURE

Describes a multifunction circuit that operates as a high-gain amplifier, or with slight modification as a quadrature detector, with a substantial portion thereof capable of being formed as a monolithic semiconductor integrated circuit. Featured are versatile operating modes especially suitable for use in frequency modulation systems and in television sound systems. For the quadrature detector mode, the circuit employs a phase-shift means and a phase-frequency means to eliminate the need of a transformer. In addition, an integrating means is placed across the output terminals to provide an output signal having a shifting D-C level linearly proportional to frequency variations in the input signal.

This invention relates to a multifunction circuit capable of operating as a high-gain amplifier or with slight modification, as a quadrature detector, and with a substantial portion thereof capable of being formed as a monolithic semiconductor integrated circuit.

Prior to this invention, most detector circuits for use in frequency modulation systems and in television sound systems have required transformers. No presently known techniques are available to integrate or to fabricate a monolithic semiconductor integrated circuit having a transformer as one of its elements. Accordingly, there is a need for a circuit which can perform FM detector functions, and, at the same time, comprise elements which are readily formed as part of an integrated circuit. In addition, because of the high cost of manufacturing semiconductor devices, and the resulting desirability of producing integrated circuits using high volume techniques, there is a need to design a versatile circuit which can be used in more than one application. Although general purpose amplifiers are available in integrated circuit form, none so far has been capable of operating as a quadrature detector, principally because of the difficulty of integrating the transformer function into the semiconductor device.

Briefly, the multifunction circuit of this invention comprises an amplifier including a pair of signal-handling devices, the first providing a first input signal-handling device (preferably a semiconductor device, such as a first transistor) and having an input means, the second providing an output signal-handling device (preferably a semiconductor device, such as a second transistor) having an output means. Coupled to the first and second signal-handling devices is a third signal-handling device (preferably a semiconductor device, such as a third transistor), the latter device having a terminal means adapted for coupling a phase-frequency means (preferably a quadrature tank circuit) thereto. The circuit parameters and components are proportioned so that the overall circuit functions as an FM quadrature detector when the phase-frequency means is coupled to the terminal means, but functions as an amplifier when the phase-frequency means is decoupled. Both the FM quadrature detector and the amplifier receive their input signals at the input means of the first signal-handling device and their output signals emerge from the output means of the second signal-handling device. A substantial portion of the multifunction circuit can be fabricated as a monolithic semiconductor integrated circuit.

The invented circuit eliminates some of the problems discussed previously that heretofore have plagued the semiconductor industry. Being capable of operating as either a quadrature detector or as a high-gain amplifier, the invented circuit is useful for a variety of FM and TV sound applications, thus ensuring a large-scale demand, high-volume production, and the resulting lower manufacturing cost per unit. In addition, the invented circuit can perform the phase-shift function needed for quadrature detector operating without the use of a transformer, which alone reduces the component cost to about one-third to one-eighth the cost of a circuit requiring a transformer. Further, because all of the basic components can be readily fabricated as a monolithic semiconductor integrated circuit, the number of components needed to perform the function of FM detection is reduced, resulting in another cost saving.

The invention may be understood better from the following detailed description and the accompanying drawings in which.

Figure 3:
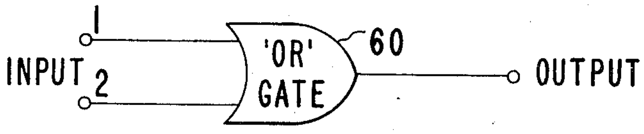
Figure 4:
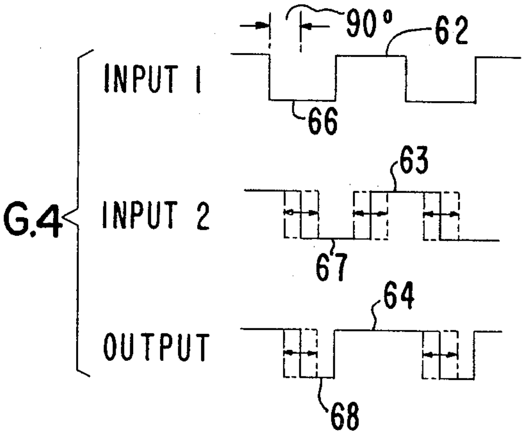
Figure 5:

FIGS. 3–5 indicate a logic symbol for the quadrature detector mode of operation and some typical input and output waveforms.

Figure 6:
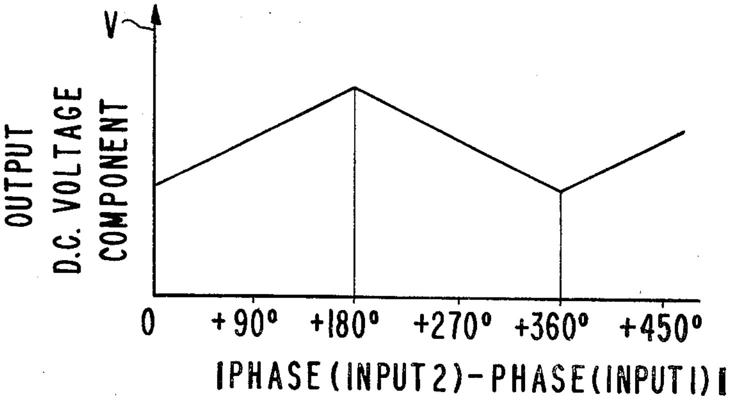

FIG. 6 is a graph in which the phase difference of the two input signals is plotted against the D-C component of the output signal after the A-C component has been filtered out.

Figure 7:
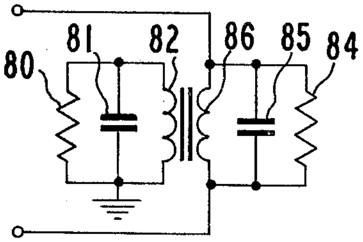
Figure 8:
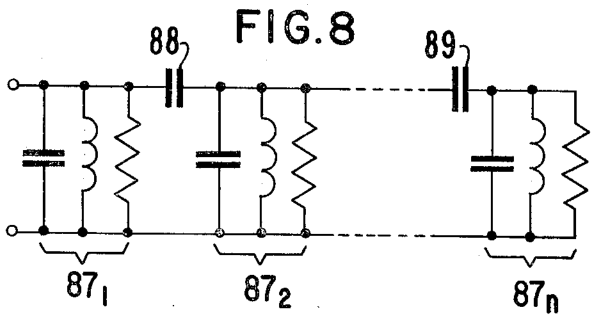
Figure 9:
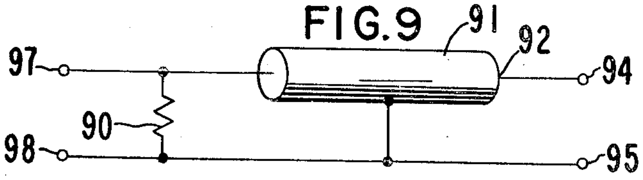

FIGS. 7 to 9 contain some schematic circuit diagrams of alternate embodiments of the phase-frequency means which can be coupled to the circuit of the subject invention.

Figure 1:
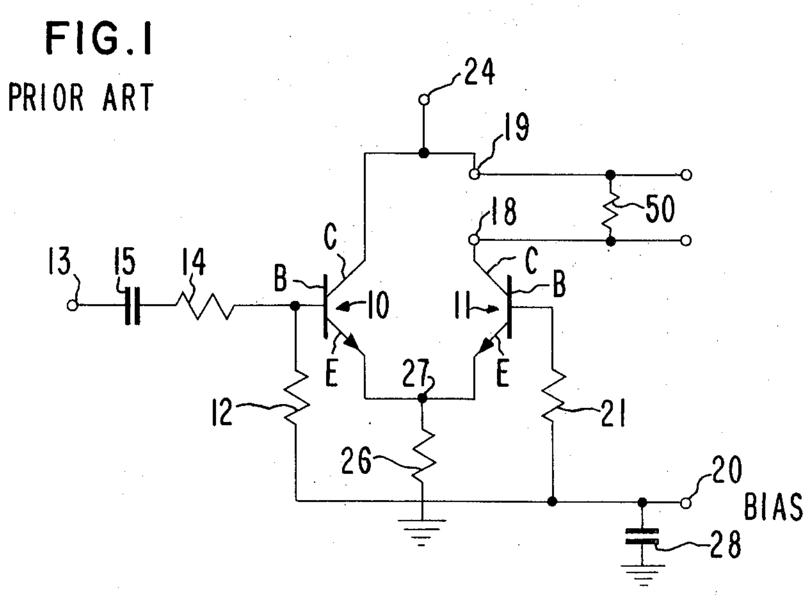
FIG. 1 PRIOR ART
FIG. 1 is a simplified schematic drawing of a prior art amplifier typical of the kind that can be fabricated as an integrated circuit.

Referring to FIG. 1, a typical prior art amplifier capable of being formed as an integrated circuit is illustrated. The amplifier comprises a pair of signal-handling devices shown as NPN transistors 10 and 11, each having a base B, an emitter E, and a collector C. An input terminal 13 is coupled to the base of the first transistor 10 via a first impedance, which may consist of a resistor 14 and a capacitor 15. The emitter of transistor 10 is coupled to the emitter of transistor 11, and both are coupled to a common terminal 27 of resistor 26, the other terminal thereof being coupled to a point of reference potential indicated as ground. (If desired, a current source may be used in place of resistor 26.) A supply voltage for the circuit is applied at terminal means 24, which is coupled to the collector of transistor 10 and to output terminal 19. Another output terminal 18 is coupled to the collector of transistor 11. The two transistors 10 and 11 are rendered operative by a bias potential applied to terminal means 20, which is coupled to the respective bases of transistor 10 and 11 by respective resistors 12 and 21. A bypass capacitor 28 removes A-C fluctuations in the bias potential. The components are selected so that resistor 14 has a resistance value between zero and several kilohms, depending upon the compromise between (1) the isolation of the input signal and the varying input admittance of the first transistor 10 with varying input signals, and (2) the reduced power gain due to a high value of resistance. Resistor 12 is chosen so that the insertion loss across it is small compared with the power supplied to the base of the first transistor 10 but at the same time allows the D-C bias voltage applied thereto to be well defined. Resistor 21 is selected such that D-C bias on the second transistor 11 is approximately the same as that on the base of the first transistor 10. Capacitor 15 has a value of susceptance normally similar to or greater than the combined admittance of resistor 14, resistor 12, and the input to the first transistor 10. Then, if the characteristics of transistors 10 and 11 are similar, and a connection is made between terminals 18 and 19, the two transistors share equally the current through the common-emitter load resistor 26 (or through a current source used in place of resistor 26, as mentioned previously).

The operation of the emitter-coupled amplifier shown in FIG. 1 is similar to emitter-coupled circuits as found in the semiconductor art. A load impedance, such as a resistor 50, is usually connected across the output terminals 18 and 19 during operation. When a positive-going input signal is applied to the base of transistor 10, the current flowing from the supply voltage terminal 24 down through the collector to the emitter of transistor 10 tends to increase. Increased current also flows from the emitter of transistor 10 through resistor 26 to ground. Due to the increase in current through resistor 26, a greater voltage differential exists across resistor 26, resulting in the common junction 27 between the two emitters of transistor 10 and 11 being at a higher positive potential than before. Hence, a higher voltage potential appears at the emitter of transistor 11, causing less current to flow from the collection to the emitter of transistor 11, and less current to flow through transistor 11 from the supply voltage 24. With less current flowing through transistor 11, the voltage drop across the output load resistor 50 between terminals 18 and 19 is lower; terminal 18, then, is at a higher voltage compared to ground when the current flowing through transistor 11 is lower.

On the other hand, a negative-going signal applied to the base of transistor 10 causes less current to flow from the collector to the emitter of transistor 10, and in turn, less current to flow through resistor 26, resulting in a lower voltage drop to occur across resistor 26. Hence, the common junction 27 between the emitter of transistor 10 and the emitter of transistor 11 is at a lower voltage potential, and a lower potential appears at the emitter of transistor 11, causing more current to flow from the collector to the emitter of the transistor 11, and across the output load resistor 50. Then, with an increased current across resistor 50, the voltage drop is greater, causing a lower potential to appear at terminal 18.

To summarize then, a positive-going input signal applied to the base of transistor 10 causes more current to flow through transistor 10, resulting in a higher voltage drop across resistor 26; in turn, a more positive voltage appears at the emitter of transistor 11, causing less current to flow through transistor 11, a lower voltage drop to occur across output resistor 50, and a higher output voltage to appear at the output terminal 18. Conversely, a negative-going signal on the base of transistor 10 causes less current to flow through transistor 10, resulting in a smaller voltage drop across resistor 26; in turn, a lower voltage potential appears on the emitter of transistor 11, causing more current to flow through transistor 11, a higher voltage drop to occur across the output resistor 50, and a lower output voltage to appear at the output terminal 18.

Figure 2:
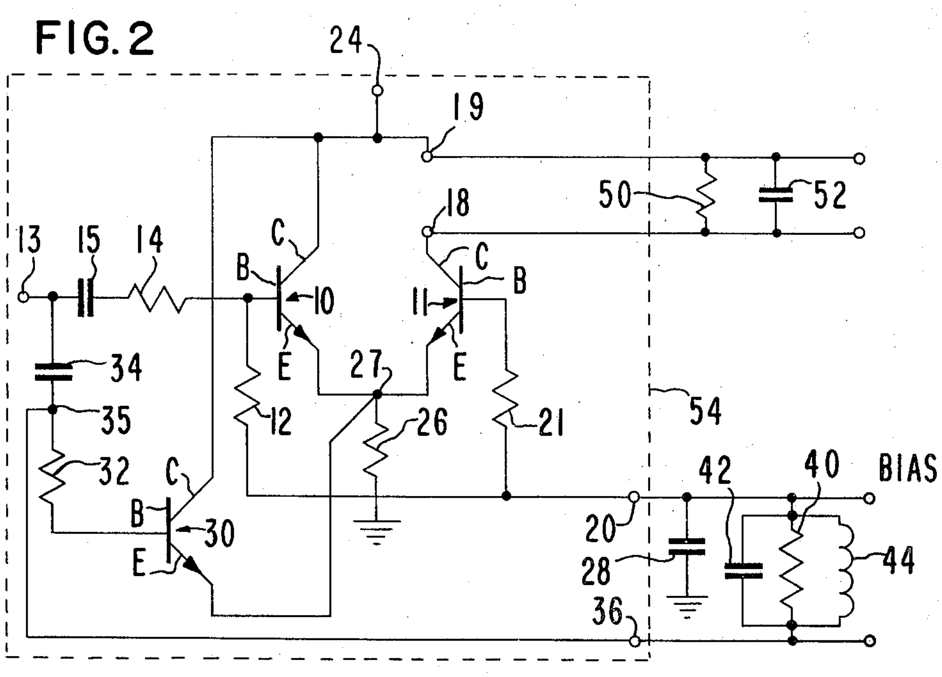
FIG. 2 is a schematic circuit diagram of the preferred embodiment of the circuit of the subject invention.

In FIG. 2, the invented circuit is shown in which a third signal-handling device, indicated as a third transistor 30, has been added to the basic amplifier circuit of FIG. 1. The base of transistor 30 is coupled to the input terminal 13 by a second impedance, which may comprise a resistor 32 and a capacitor 34. A quad bias terminal 36 is provided for applying a bias potential via resistor 32 to transistor 30 to render it operative. If the terminal 36 is either left as an open circuit or connected to ground, no bias potential is applied to the base of transistor 30. Any signal appearing at the base of the transistor 30 and sufficiently small will cause no or a relatively insignificant amount of collector current to flow in transistor 30 (for example, an input signal less than about 3 volts RMS). The addition of the third transistor 30 and the second impedance has no substantial effect on the operation of basic amplifier circuits. Functionally, then, the circuits shown in both FIGS. 1 and 2 are similar during the amplifier mode of operation.

The invented circuit of FIG. 2 may operate as a quadrature detector by the cooperation of a phase-shift means coupled between the respective inputs to the first and third signal-handling devices, and a phase-frequency means coupled between bias terminals 20 and 36. A phase-shift means functions to shift the phase between the input signals applied to the two input signal-handling devices by approximately 90 degrees. In the specific embodiment of FIG. 2, the phase-shift means may be accomplished by proper selection of capacitors 34 and 15. For example, the capacitive reactance to the base of transistor 10 may differ by an order of magnitude from the capacitive reactance to the base of transistor 30.

A phase-frequency means functions to shift the phase of an input signal applied to the third signal-handling device in proportion, preferably approximately linear, to the difference between the actual frequency of the input signal and a given center frequency. A preferred phase-frequency means for the invented multifunction circuit comprises a parallel LCR quadrature tank circuit, shown in FIG. 2 as resistance 40, capacitor 42, and inductor 44, having a resonant frequency at or near the center frequency of the input signal. The phase-frequency means is tuned so that at the center frequency of the input signal, the combined effect of the phase-shift means and the phase-frequency means is such that the total phase shift between the input signals to the base of transistor 10 and the input signals to the base of transistor 30 is substantially 90 degrees. It should be noted that the phase-shift means (comprising capacitors 15 and 34) is part of the basic components that can be formed as a monolithic semiconductor integrated circuit, which is indicated by a dotted line 54. Those components not enclosed by the dotted line 54 are not considered part of the basic integrated circuit.

Selection of components for the quadrature mode of operation is such that resistor 32 has a resistance value approximately the same as that of resistors 12 and 21. Selection of capacitor 34 is such that its capacitive reactance is much larger in value than the combined impedance of the quadrature tank circuit at resonance, resistor 32, and the input resistance of transistor 30, preferably by an order of magnitude or more. In general, then, it is desirable that the capacitance of capacitor 34 be be smaller than that of capacitor 15 by approximately an order of magnitude. The components are thus properly balanced so that if the phase-frequency means is coupled between bias terminals 20 and 36, a bias potential is applied to terminal 20, a short is connected across output terminals 18 and 19, and there is no input signal, then transistors 10, 11, and 30 have similar characteristics and share equally the current flowing through the emitter load resistor 26.

For operation of the quadrature detector, a network to integrate the output signal is coupled between output terminals 18 and 19. In FIG. 2 the network is shown as an output load resistor 50 connected in parallel with an output capacitor 52. As with the phase-frequency means, the integrating output network is not part of the basic integrated circuit, and hence, is not included within the dotted line 54. The detector circuit is rendered operative when the input signal has a voltage swing sufficiently great (that is, at least one-half of a volt peak-to-peak) so that the two transistors 10 and 30 can be turned on or turned off, depending upon the voltage level of the input signal. With the circuit arrangement shown, operating the transistors 10 and 30 in this manner also will cause the output transistor 11 to turn on or off.

As mentioned previously, the phase-shift means and phase-frequency means combine to cause the phase of input signal appearing at the inputs to the first and third transistors to differ by substantially 90 degrees. When the frequency of the input signal varies from a center frequency, the phase of the voltage across the tank circuit also varies as a function of the change in frequency, which in turn causes the phase difference between the two input signals to vary approximately linearly. If the percentage frequency variation of the input signal is small, then the relationship between frequency change and phase shift becomes linear. Recapitulating, the input signal applied to the base of transistor 30 is of the same frequency as the input signal applied to the base of transistor 10 but differs in phase by 90 degrees when the frequency of the input signal is approximately at the center frequency of a frequency modulated input signal. When the input signal frequency varies, either above or below the mean center frequency, then the phase difference between the signal applied to the base of transistor 10 and the signal applied to the base of transistor 30 are changes, with the change being an approximate linear function of the change in frequency of the input signal.

To summarize, the quadrature detector circuit operates in a mode in which the three transistors 10, 11, and 30 are caused to turn on or turn off, so that the circuit function is similar to that of a typical logic OR gate. This similarity can be seen from Table I. In this table, input 1 represents the input signal to the base of transistor 10, input 2 represents the input signal to the base of transistor 30, and output represents the signal appearing at the output terminal 18 (without the integrating output capacitor 52).

TABLE I

| Input 1 | Input 2 | Output |
|---|---|---|
| HI | LO | HI |
| LO | HI | HI |
| HI | HI | HI |
| LO | LO | LO |

FIG. 3 shows a logic symbol 60 for the quadrature detector mode of operation, and some typical input and output waveforms are indicated in FIG. 4. The solid line in FIG. 4 represents a phase-shift of 90 degrees, the dotted line represents a phase-shift greater than 90 degrees, and the dashed and dotted line represents a phase-shift less than 90 degrees. As can be seen from both Table I and FIG. 4, a positive-going (HI) input signal 62 or 63 applied to the base of respective transistor 10 or 30 causes a positive-going (HI) output signal 64 to appear at the output terminal 18. Only when negative-going (LO) input signals 66 and 67 appear at both the respective bases of transistor 10 and transistor 30 will a negative-going (LO) output signal 68 appear at terminal 18. Note that when the frequency of the input signal varies above or below the center frequency, the phase of the input 2 signal (input to transistor 30) shifts so that the phase difference with respect to the input 1 signal (input to transistor 10) is respectively greater or less than 90 degrees. This phase shift in turn determines the length of time the output signal at terminal 18 is at a "HI" or "LO" level (that is, the length of time transistor 11 is turned on or turned off). The length of time the output signal is at a "HI" or "LO" level then, is approximately a linear function of the change in frequency of the input signal.

The output network, comprising resistor 50 connected in parallel with capacitor 52 and coupled across output terminals 18 and 19, serves to integrate the output pulses, so that the value of the integrated output signal is approximately linearly proportional to the change in frequency of the input signal, as indicated in FIG. 5. The solid line 70 indicates a typical value of the integrated output signal when the input signal is at the center frequency and the phase shift is 90 degrees; the dotted line

72 indicates a typical value when the input signal frequency is greater than the center frequency and the phase shift is greater than 90 degrees; and the dashed and dotted line 74 illustrates a typical value when the input signal frequency is less than the center frequency and the phase shift is less than 90 degrees.

FIG. 6 demonstrates the general relationship between the output D-C or low-frequency component of an OR gate when the phase between the two input signals is varied. For the case when the phase-frequency means is a simple tuned circuit consisting of a parallel inductor, capacitor, and resistor, the maximum phase shift variation would be ±90 degrees.

Although operation of the quadrature detector is described with a single-tuned LCR circuit coupled between terminals 20 and 36, there are many other types of networks that can be used as the phase-frequency means; therefore, the invention is not limited to the single quadrature tank circuit shown. For example, very good linearity may be obtained by using a double-tuned, transformer-coupled LCR circuit for the phase-frequency means. For example, FIG. 7 shows a parallel LCR network, comprising a resistor 80, a capacitor 81, and a coil 82 which is transformer-coupled to a second parallel LCR network, comprising a resistor 84, a capacitor 85, and a coil 86. If resistors 80 and 84 have similar resistive values and capacitors 81 and 85 have similar capacitive values, the phase-frequency linearity of this double-tuned circuit is optimized by choosing the product of the coefficient of coupling between coils 82 and 86 multiplied by the Q factor of either network (assuming them to have similar Q values) to be equal to 0.7. The double-tuned circuit provides much higher detector sensitivity for a given linearity when compared with the single-tuned circuit shown in FIG. 2. In fact, using the double-tuned circuit, one should be able to obtain linearities as good as the best ratio detectors and discriminators available for use in high-quality FM tuners. Another possible phase-frequency means is the multi-tuned circuit, which comprises a large number of synchronously tuned LCR networks $87_1$–$87_n$ coupled together as shown in FIG. 8. The coupling may be accomplished with capacitors, as for example, capacitors 88 and 89. The multi-tuned circuit should give nearly perfect linearity. Finally, FIG. 9 indicates another possible phase-frequency means, comprising a resistor 90 connected in parallel with a delay line 91 that is linearly responsive ideally to any change in frequency from a predetermined value. For example, the resistor 90 may have a value of 2 kilohms and the delay line 91 may be 8 inches in length of type RG–176/U. Also, the delay line 91 may have one end 92 connected either as an open or as a short circuit. For example, with no connection between terminals 94 and 95, an open circuit condition occurs which provides essentially a D-C resistance between terminals 94 and 95, the resistance value being approximately the value of resistor 90. Conversely, when terminal 94 is coupled to terminal 95, a closed circuit condition occurs which provides minimum D-C resistance between terminals 94 and 95.

In order to provide an illustration of an operative embodiment of the multifunction circuit in accordance with the above description and applicable drawings, suitable values for the various components are given below:

Resistors:
- 14—2.5 kilohms
- 20—1.5 kilohms
- 21—500 ohms
- 26—330 ohms
- 32—1.5 kilohms Capacitors:
- 15—20 picofarads
- 34—3 picofarads
- 28—0.1 microfarad Transistors:
- 10—2N918

Transistors:
11—2N918
30—2N918
Bias voltage applied to terminal 20—2 volts
Supply voltage applied to terminal 24—12 volts The transistors, resistors, and capacitors having the values indicated and enclosed in the dashed line 54 can be readily fabricated into a semiconductor integrated circuit, as is clearly obvious to one having ordinary skill in the art. For the quadrature detector mode of operation with the center frequency of the input signal being 4.5 megahertz, a parallel LCR single-tuned tank circuit having a capacitor of 560 picofarads, a coil of $2.2 \times 10^{-6}$ henries, and a resistor of 2 kilohms, tuned to a resonant frequency of 4.5 megahertz, was coupled between the two bias terminals 20 and 36. Integration of the output signal was accomplished by a parallel RC filter coupled across the output terminals, the resistor 50 being 4.7 kilohms and the capacitor 52 being 0.01 microfarad.

While the present invention has been illustrated and described with respect to specific embodiments, it will be appreciated that numerous variations and modifications in the selection, combination, and arrangement of components may be made without departing from the scope and spirit of the invention. For example, in place of bipolar transistors as the semiconductor signal-handling devices, it is within the scope of the invention to use MOS transistors, FET transistors, or any other type of semiconductor device which can perform the described functions and easily be formed as a monolithic semiconductor integrated circuit.

What is claimed is:

1. A multifunction circuit comprising:
an input terminal;
a first signal-handling device coupled to said input terminal and responsive to signals therefrom;
a second signal-handling device responsive to output signals from said first device and having an output means;
a third signal-handling device responsive to signals from said input terminal and having its output coupled to the input of said second device;
means coupled between said input terminal and the inputs of said first and third signal-handling devices for producing a pedetermined relative phase shift between signals at the inputs of said first and third devices;
a first bias terminal means coupled to said first and second signal-handling devices for applying a bias potential thereto to render said devices operative;
a second bias terminal means coupled to said third signal-handling device for applying a bias potential thereto, whereby the absence of a bias potential applied to said third signal-handling device renders said device inoperative, and said multifunction circuit operates as an amplifier, receiving its input signals at the input of said first signal-handling device and its output signal emerging from said output means of said second signal-handling device.

2. The circuit recited in claim 1 wherein said means for producing a relative phase shift comprises a first impedance coupled between said input terminal and said first signal-handling device and a second impedance coupled between said input terminal and said third signal-handling device, the reactance of one of said impedances being approximately an order of magnitude greater in value than the other.

3. The circuit recited in claim 2 wherein said first, second, and third signal-handling devices comprise first, second, and third transistors respectively, whereby said circuit can be formed as a monolithic semiconductor integrated circuit.

4. The circuit recited in claim 2 wherein said first and second impedances have capacitive reactance.

5. The circuit of claim 4 wherein said greater capacitive reactance is coupled between said input terminal and the input of said third signal-handling device.

6. The circuit recited in claim 2 including a phase-frequency means coupled between said second bias terminal means and a source of bias potential for rendering said third signal-handling device operative, said phase-frequency means being responsive to variations in the frequency of an input signal with respect to a center frequency for producing a corresponding shift in the phase of the input signal to said third device, said phase frequency means being adjusted so that the total phase shift at said center frequency between the signals at the inputs of said first and third devices is substantially 90 degrees; and means coupled to said output means for detecting a signal proportional to changes in frequency of an input signal with respect to a predetermined center frequency, whereby said multifunction circuit operates as an FM quadrature detector.

7. The circuit recited in claim 6 wherein said phase-frequency means comprises a quadrature tank circuit having a resonant frequency near said center frequency, said tank circuit causing the phase of a signal applied thereto to shift by an amount that is approximately a linear function of the variation between said resonant frequency and the frequency of said applied signal.

8. The circuit recited in claim 6 wherein said first, second, and third signal-handling devices comprise first, second, and third transistors respectively, and wherein during said quadrature detector mode of operation, said second transistor is in an "off" non-conducting state whenever either of said first and third transistors is in an "on" conducting state; and, said second transistor is in an "on" conducting state whenever both said first and third transistors are in an "off" non-conducting state.

9. The circuit recited in claim 3 wherein said first transistor has a collector coupled to a supply voltage terminal means, a base coupled both to said input means and to said first bias terminal means, and an emitter coupled to one terminal of a common-emitter resistor; said second transistor has a collector coupled to said output means whereby said output means is coupled between said collector and said supply voltage terminal means, a base coupled to said first bias terminal means, and an emitter coupled to said one terminal of said common-emitter resistor; and said third transistor has a collector coupled to said supply voltage terminal means, a base coupled to said second bias terminal means and to said input means, and an emitter coupled to said one terminal of said common-emitter resistor.

References Cited

UNITED STATES PATENTS

| | | | |
|---|---|---|---|
| 3,084,291 | 4/1963 | Verstraelen et al. | 329—103 X |
| 3,217,263 | 11/1965 | Starreveld et al. | 325—349 X |
| 3,324,399 | 6/1967 | Hall | 329—50 X |
| 3,366,889 | 1/1968 | Avins | 307—237 X |
| 3,414,823 | 12/1968 | Knox | 328—166 X |

ALFRED L. BRODY, Primary Examiner

U.S. Cl. X.R.

329—124, 129; 307—262, 234; 328—166; 330—30